United States Patent
Akashi et al.

[11] Patent Number: 5,477,806
[45] Date of Patent: Dec. 26, 1995

[54] METHOD OF PRODUCING SILISON SINGLE CRYSTAL

[75] Inventors: Yoshihiro Akashi; Setsuo Okamoto; Kaoru Kuramochi, all of Hyogo; Takayuki Kubo, Osaka, all of Japan

[73] Assignee: Sumitomo Sitix Corporation, Hyogo, Japan

[21] Appl. No.: 210,998

[22] Filed: Mar. 21, 1994

[30] Foreign Application Priority Data

Mar. 22, 1993 [JP] Japan ................. 5-062167

[51] Int. Cl.⁶ ............................ C30B 15/20
[52] U.S. Cl. .................... 117/17; 117/13; 117/20
[58] Field of Search ................. 117/13, 17, 20, 117/30, 54, 56, 82, 83, 931, 932

[56] References Cited

U.S. PATENT DOCUMENTS

| | | | |
|---|---|---|---|
| 4,243,471 | 1/1981 | Ciszek et al. | 117/931 |
| 4,511,428 | 4/1985 | Chosh et al. | 117/20 |
| 4,645,560 | 2/1987 | Matsumoto et al. | 117/17 |

FOREIGN PATENT DOCUMENTS

| | | |
|---|---|---|
| 4319788A1 | 12/1993 | Germany. |
| 34-8242 | 9/1959 | Japan. |
| 61-215285 | 9/1986 | Japan. |
| 61-205691 | 9/1986 | Japan. |
| 61-205692 | 9/1986 | Japan. |
| 61-150862 | 9/1986 | Japan. |
| 62-880 | 1/1987 | Japan. |
| 62-153191 | 7/1987 | Japan. |
| 63-252989 | 10/1988 | Japan. |
| 3-228894 | 10/1991 | Japan. |

OTHER PUBLICATIONS

German Office Action dated May 23, 1995 and English translation.

Primary Examiner—R. Bruce Breneman
Assistant Examiner—Felisa Garrett
Attorney, Agent, or Firm—Burns, Doane, Swecker & Mathis

[57] ABSTRACT

A solid layer is melted from the upper part thereof by the heat of a heater while the contact area between a molten liquid layer and an inner wall of a crucible is adjusted in a Double Layered CZ method, so that the eluting amount of oxygen from the crucible to the molten liquid layer is controlled. Accordingly, silicon single crystals of the low concentration of oxygen are produced.

6 Claims, 7 Drawing Sheets

METHOD OF PRODUCING SILISON SINGLE CRYSTAL

BACKGROUND OF THE INVENTION

1. Field of the Invention

This invention relates to a method of producing a silicon single crystal to be used as a semiconductor material.

2. Description of Related Art

Generally, Czochralski (CZ method) has been widely employed to obtain silicon single crystals. A growing apparatus used in the above CZ method is shown in a schematic sectional view of FIG. 1. Referring to the drawing, a crucible 11 set inside a chamber consists of an inner container 11a made of quartz in the shape of a bottomed cylinder and an outer graphite container 11b fitted outside the inner container 11a. A resistance-heating type heater 12 is disposed concentrically outside the crucible 11. A molten liquid 13 having a material of crystals melted by the heater 12 is filled in the crucible 11, in which is soaked a seed crystal 15 suspended by a lift axis 14 of a lift rod or a wire or the like. When the seed crystal 15 is pulled up while being rotated, the molten liquid 13 is coagulated at the lower end of the seed crystal 15, thereby to grow a single crystal 16.

In executing the above-described CZ method to grow a semiconductor single crystal, in many cases, impurity elements are added to the molten liquid 13 before the seed crystal is raised so as to adjust the resistivity and the type of conduction of the resultant single crystal 16. However, the added impurities are disadvantageously segregated in the growing direction of the single crystal 16, and therefore, the obtained single crystal 16 does not show uniform electric characteristics in the growing direction. The segregation results from the fact that the ratio of the concentration of impurities $C_S$ in the single crystal 16 to the concentration of impurities $C_L$ in the molten liquid 13, $C_S/C_L$ at the growing interface between the single crystal 16 and the molten liquid 13, that is, the effective segregation coefficient Ke is not equal to 1. Supposing that Ke<1, for example, the concentration of impurities $C_L$ in the molten liquid 13 is increased in accordance with growing of the single crystal 16, thus leading to the segregation of the single crystal 16.

A Double Layered CZ method has been known as a method of restricting the segregation depicted hereinabove. FIG. 2 is a schematic longitudinal sectional view showing a growing apparatus of crystals used in the Double Layered CZ method. The Double Layered CZ method arranges the coexistence of a solid layer 18 of a crystal material and a molten liquid layer 17 of the crystal material respectively in the lower part and the upper part of the crucible 11 under the control by the heater 12. While the concentration of impurities in the molten liquid layer 17 is kept constant, the seed crystal 15 is dipped into the molten liquid layer 17 and pulled up to grow a single crystal 16. In this case, there are two methods, i.e., a method with constant thickness and a method with varied thickness proposed to maintain the concentration of impurities in the molten liquid layer 17.

According to the method with constant thickness, the solid layer 18 is melted as the single crystal 16 is pulled up, thus keeping the thickness of the molten liquid layer 17 constant, while the impurities are continuously added thereby to hold the concentration of impurities in the molten liquid layer 17 constant. Japanese Patent Publication Nos. 34-8242 (1959), 62-880 (1987), Japanese Utility Model Application Laid-Open No. 62-150862 (1986), and Japanese Patent Application Laid-Open No. 63-252989 (1988), etc., reveal the method. On the other hand, according to the method with varied thickness, the crucible 11 or the heater 12 is moved up and down as the single crystal 16 grows, so as to change the thickness of the molten liquid layer 17, so that the concentration of impurities in the molten liquid layer 17 is held constant without adding impurities when the single crystal 16 is being pulled up, as is disclosed in Japanese Patent Application Laid-Open Nos. 61-205691 (1986), 61-205692 (1986), 61-215285 (1986) and the like.

The single crystal 16 obtained by the above CZ method contains oxygen in addition to the impurity elements. As a part of the inner container 11a of quartz is dissolved into the molten liquid 13, the eluting oxygen is supplied to the single crystal 16. FIG. 3 is a schematic diagram of a mechanism for taking the oxygen from the molten liquid 13 to the single crystal 16. As shown in FIG. 3, the amount of oxygen supplied to the single crystal 16 is determined by the elution from the quartz crucible 11, the transportation b to the whole molten liquid 13 because of the convection and the evaporation c from the surface of the molten liquid 13.

As described hereinabove, the single crystal 16 produced by the CZ method includes oxygen of approximately $13 \times 10^{17} - 17 \times 10^{17}$ atoms/cc. It is thus difficult to obtain a single crystal of the lower concentration of oxygen by the CZ method.

In the MCZ method whereby a magnetic field is impressed from outside of the crucible 11 used in the CZ method to control the convection, since the supplying amount of oxygen to the silicon single crystal is decreased owing to the control of the convection b, it becomes possible to produce silicon single crystals of the oxygen concentration not larger than $10 \times 10^{17}$ atoms/cc. However, the apparatus for the MCZ method is complicated and the production cost is undesirably increased.

SUMMARY OF THE INVENTION

This invention has been developed to solve the above-described disadvantages, and the object thereof is to provide a method of producing silicon single crystals of the low concentration of oxygen by reducing the eluting amount of oxygen from a crucible, with making use of the aforementioned Double Layered CZ method, namely, the fact that the contact area between the inner wall of the crucible and the molten liquid layer is turned smaller because of the presence of a solid layer in the lower part of the crucible than that in the conventional CZ method.

According to a producing method of silicon single crystals of this invention, a material for crystals is filled and melted in the crucible and then solidified above the bottom part of the crucible, which is arranged to coexist with a molten liquid layer thereover. While the solid layer is melted from the upper side thereof by the heat of a heater set in the periphery of the crucible, the oxygen is taken from the molten liquid layer thereby to grow silicon single crystals. In the producing method, the contact area between the molten liquid layer and the inner wall of the crucible is adjusted so as to control the eluting amount of oxygen from the crucible to the molten liquid layer when the solid layer is melted. In a still further aspect of this invention, the contact area between the molten liquid layer and the inner wall of the crucible is set to be larger than 2000 cm² in the above producing method.

Accordingly, since the contact area between the molten liquid layer and the inner wall of the crucible is adjusted, the eluting amount of oxygen from the crucible is controlled, thereby making it possible to obtain silicon single crystals of a desired concentration of oxygen. For instance, when the contact area of the molten liquid layer to the inner wall of the crucible is made smaller, the eluting amount of oxygen from the crucible is reduced, so that the supplying amount of oxygen into the silicon single crystal is decreased. When the contact area is set to be 2000 cm² or smaller, it becomes possible to produce silicon single crystals of $12 \times 10^{17}$ atoms/cc or lower concentration of oxygen.

The above and further objects and features of the invention will more fully be apparent from the following detailed description with accompanying drawings.

DESCRIPTION OF THE PREFERRED EMBODIMENTS

A preferred embodiment of this invention will be fully described hereinbelow with reference to the corresponding drawings.

Figure 1:
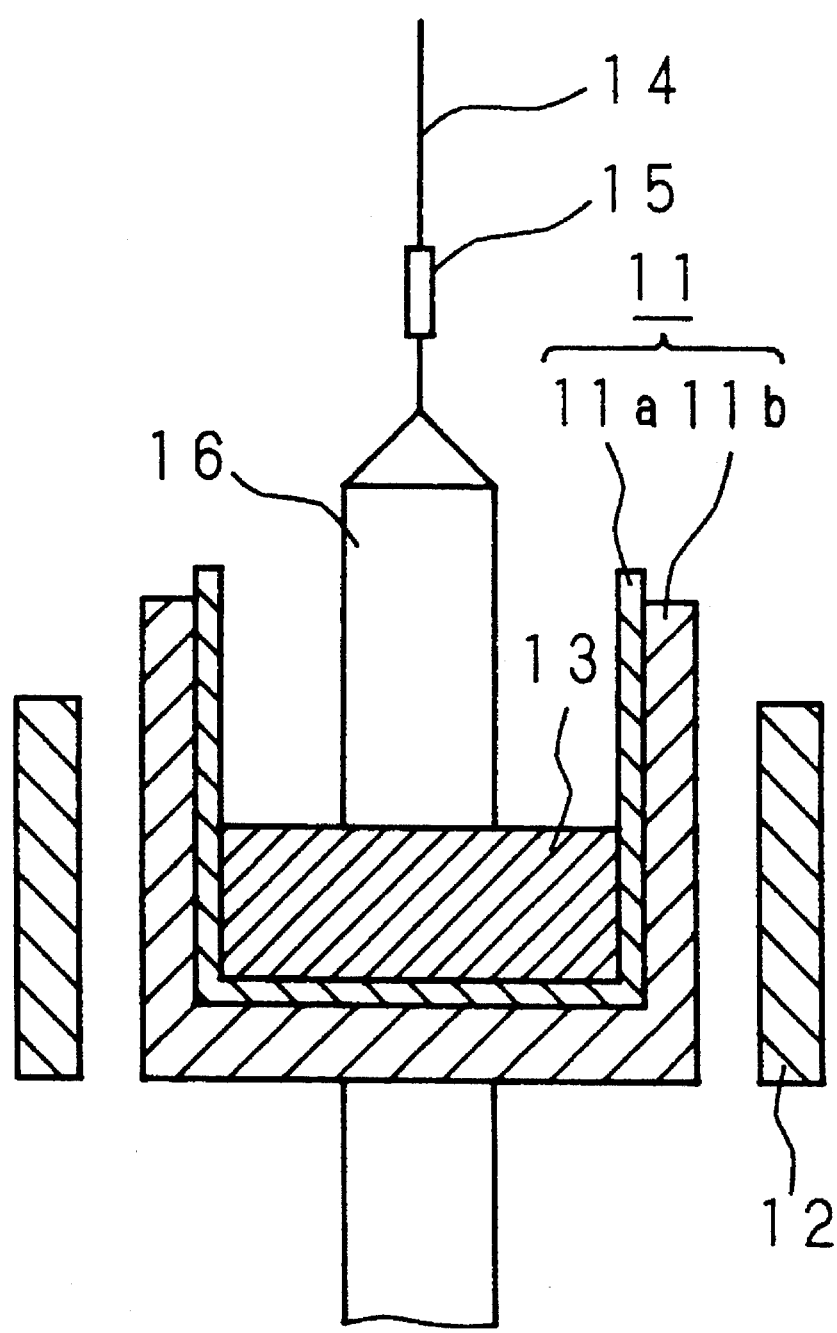
FIG. 1 is a schematic sectional diagram showing the constitution of growing apparatus of crystals employed in the CZ method.
Figure 2:
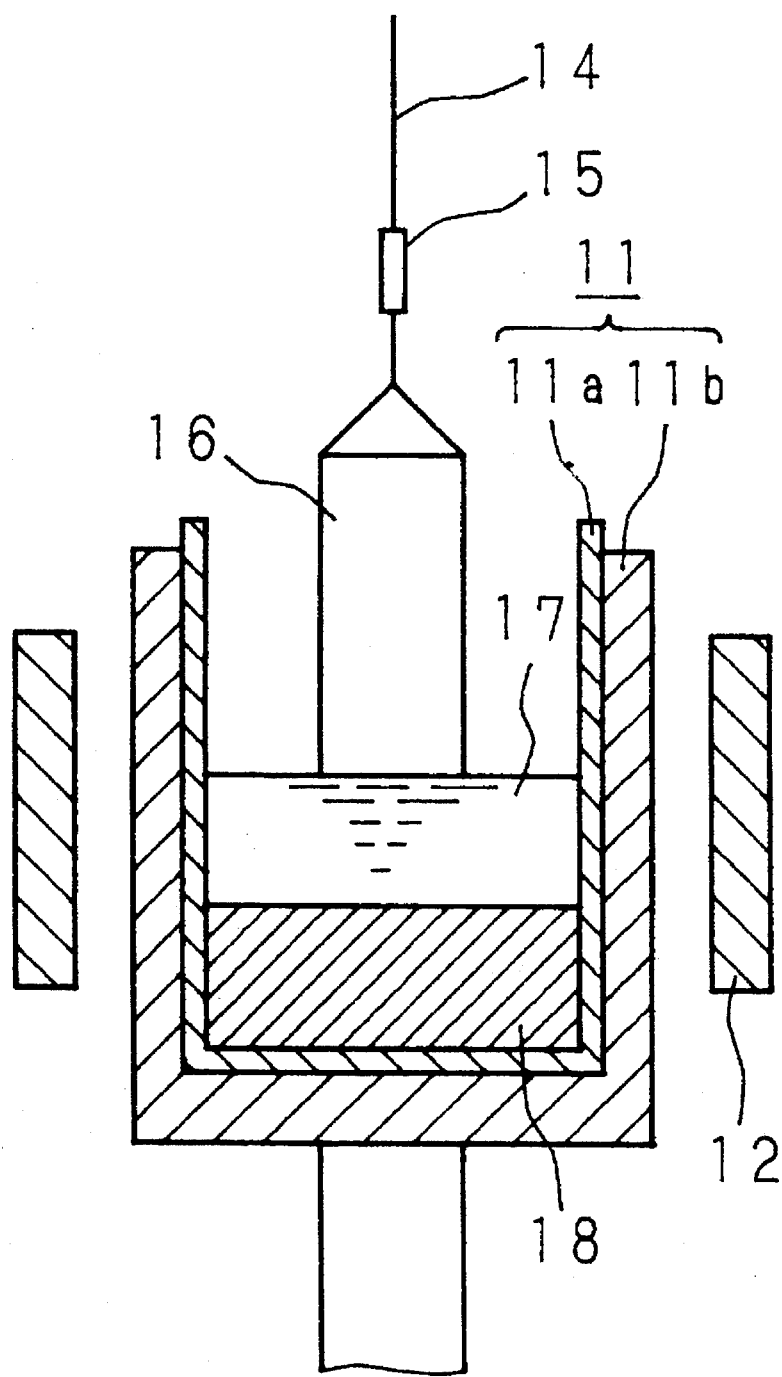
FIG. 2 is a schematic longitudinal sectional diagram of a growing apparatus of crystals employed in a Double Layered CZ method.
Figure 3:
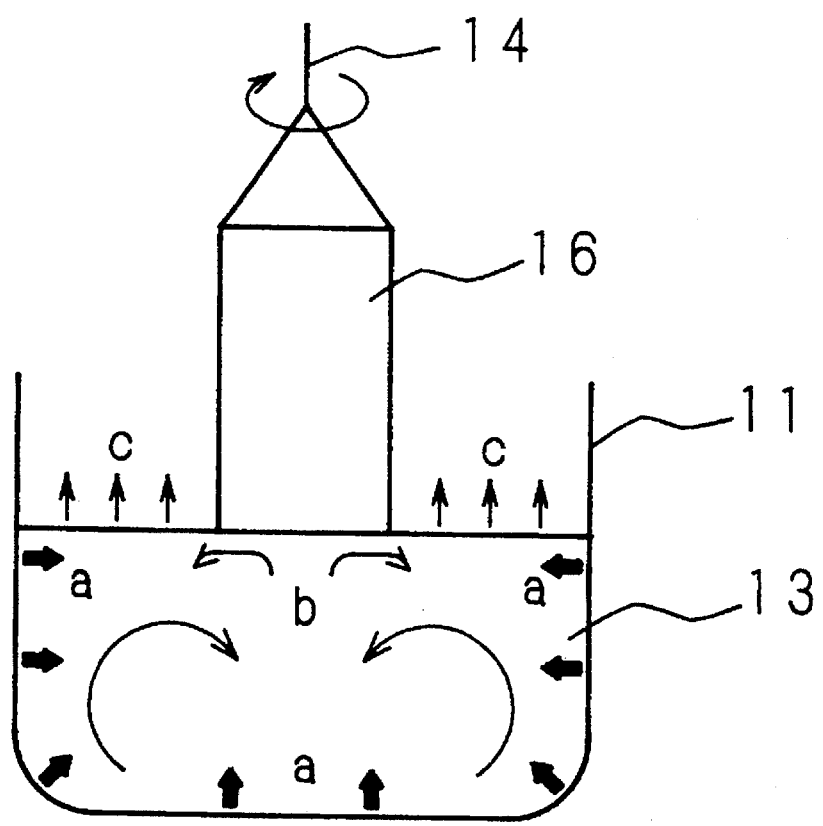
FIG. 3 is a schematic diagram of a mechanism for taking out oxygen from a molten liquid into a silicon single crystal.
Figure 4:
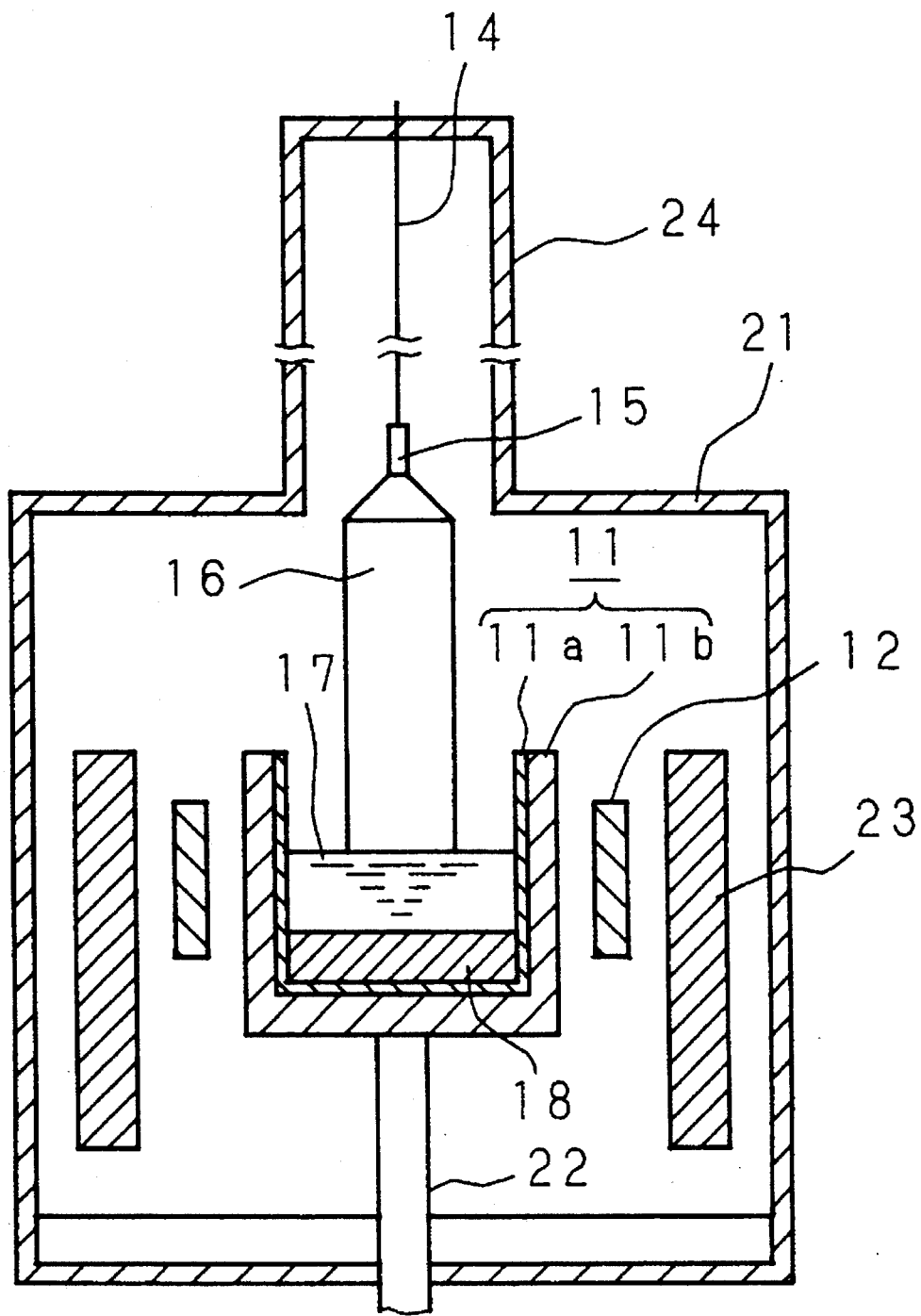
FIG. 4 is a schematic sectional diagram showing a constitution of a single crystal growing apparatus used in an embodiment of a method of this invention.

FIG. 4 is a schematic sectional diagram showing the constitution of a single crystal growing apparatus used for execution of a method of the invention. In FIG. 4, reference numeral 21 represents a chamber which is a generally cylindrical vacuum container. A crucible 11 is set approximately at the center of the chamber 21. The crucible 11 is constituted of an inner quartz container 11a of a bottomed cylinder and an outer graphite container 11b also in the shape of a bottomed cylinder fitted outside the inner container 11a. The crucible 11 is rotated and lifted by a shaft 22 mounted at the lower surface of the outer container 11b. A heater 12 of, e.g., a resistance heating type is placed at the outer periphery of the crucible 11 in a manner to be movable up and down. A heat reserving member 23 is arranged at the outer periphery of the heater 12. The thickness of each of a molten liquid layer 17 and a solid layer 18 in the crucible 11 is relatively adjusted by the adjustment of the relative position in the vertical direction of the crucible 11 and the heater 12.

Meanwhile, a lift axis 14 is suspended above the crucible 11, penetrating a small, generally guard cylinder 24 which is formed above the chamber 21 to communicate with the chamber 21. The lift axis 14 can be rotated and moved up and down. A seed crystal 15 is set at the lower end of the lift axis 14. The seed crystal 15 is, after soaked in the molten liquid layer 17 at the lower end thereof, rotated and pulled up to grow a single crystal 16 from the lower end thereof.

The single crystal is grown by this apparatus constructed as above in the following manner.

In the first place, a polysilicon as a material for single crystal 16 is filled in the crucible 11. After the material is melted by the heater 12, the material is solidified from the bottom section of the crucible 11 and the solid layer 18 is formed. Thereafter, the heater 12 or the crucible 11 is moved up and down to allow the molten liquid layer 17 to coexist with the solid layer 18 above the solid layer 18. The position of the heater 12 or the crucible 11 is controlled in order to maintain such thickness of the molten liquid layer 17 that the contact area between the molten liquid layer 17 and the inner wall of the crucible 11 becomes small and the eluting amount of oxygen from the crucible is reduced. During melting of the solid layer 18 in the above state, the lower end of the seed crystal 15 is dipped into the molten liquid layer 17 and, while the lift axis 14 is being rotated and pulled up, the single crystal 16 is generated at the lower end of the seed crystal 15. Thus, the silicon single crystal of the low concentration of oxygen is obtained.

The above producing method will be depicted more in detail with concrete numerical values. About 65 kilograms of polysilicon is filled into the crucible 11 with 16 inches diameter and 14 inches depth. The solid layer 18 is melted by the heater 12, which is 150 mm height. The thickness from the surface of the molten liquid layer 17 to the interface to the solid layer 18 is maintained constant. As a result, a silicon single crystal 16 with 6 inches diameter is formed. In this case, the thickness of the molten liquid layer 17 is varied to 140 mm, 160 mm, 180 mm and 200 mm, and the concentration of oxygen of the silicon single crystals 16 was measured.

Figure 5:
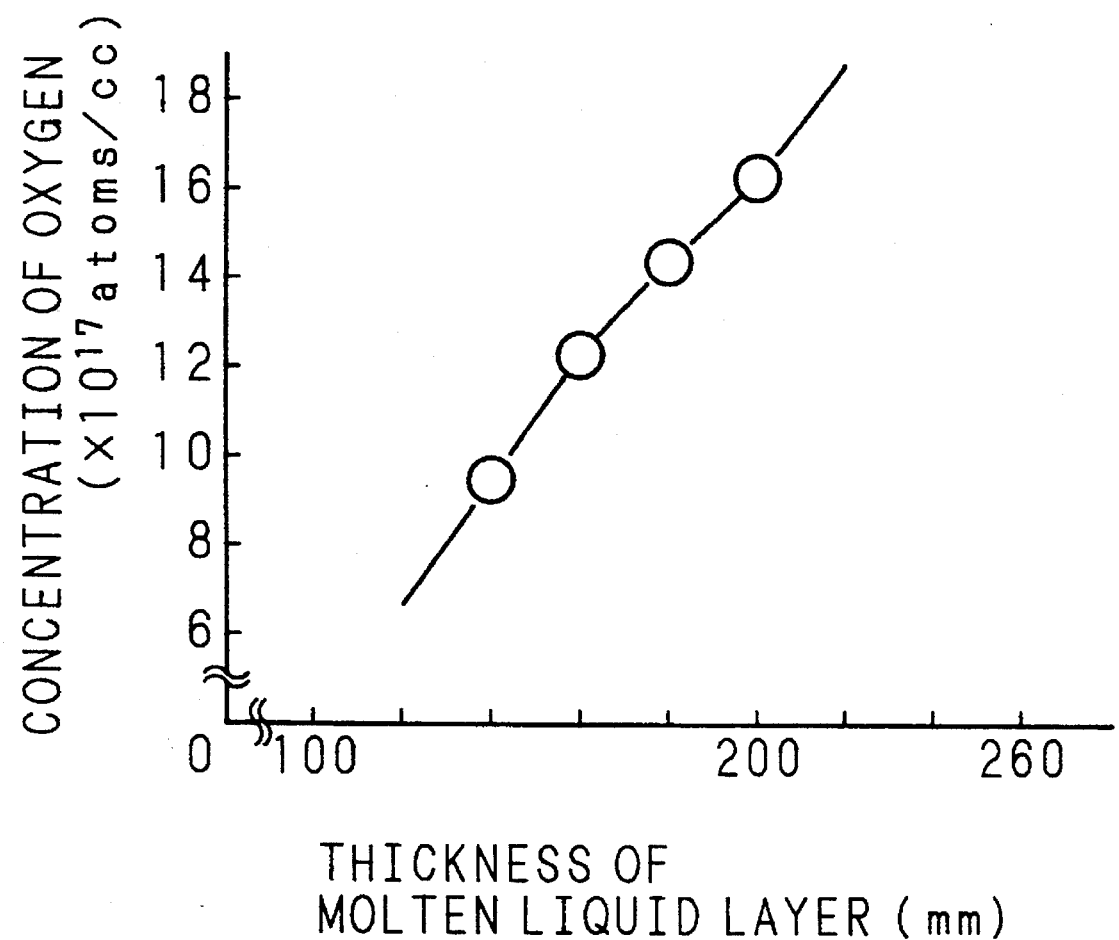
FIG. 5 is a graph of the relationship between the thickness of a molten liquid layer and the concentration of oxygen in the growing silicon single crystal.

The experimental result, more specifically, the relationship between the thickness of the molten liquid layer and the concentration of oxygen in the obtained silicon single crystal is shown in FIG. 5. The axis of abscissa represents the thickness of the molten liquid layer and the axis of ordinate indicates the concentration of oxygen. As is clear from the graph of FIG. 5, as the molten liquid layer 17 is thinner, the concentration of oxygen in the single crystal becomes lower. Table 1 below shows the thickness of molten liquid layer 17 and solid layer 18 and the contact area between the molten liquid layer 17 and the inner wall of the crucible 11 when the lift axis 14 is started to be raised, for each experiment.

TABLE 1

| Thickness of molten liquid layer (mm) | Thickness of solid layer (mm) | Contact area (cm²) |
| --- | --- | --- |
| 100 | 160 | 1256 |
| 120 | 140 | 1507 |
| 140 | 120 | 1758 |
| 160 | 100 | 2009 |
| 180 | 80 | 2260 |
| 200 | 60 | 2512 |
| 220 | 40 | 2763 |

Figure 6:
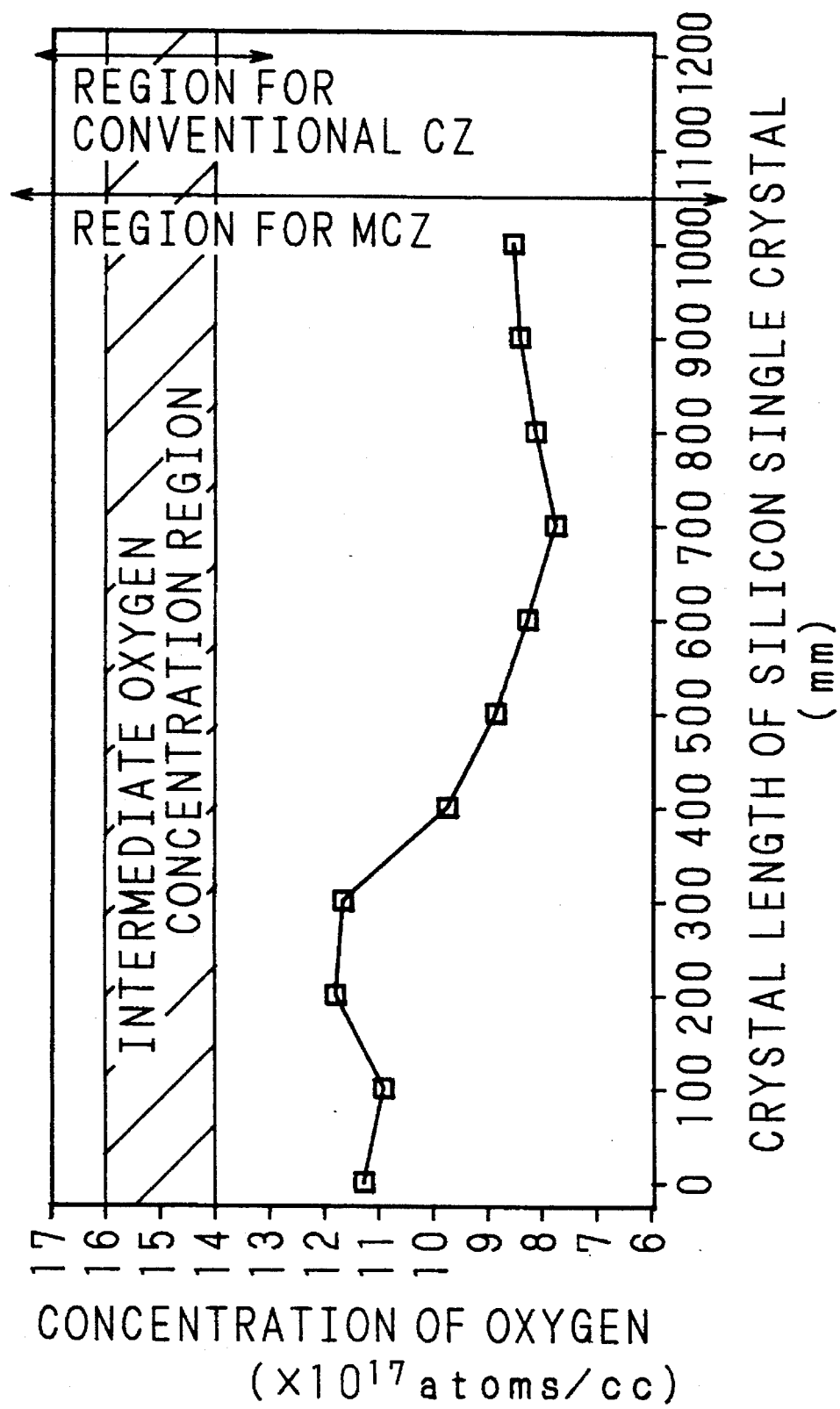
FIG. 6 is a graph of the relationship between the length of the silicon single crystal and the concentration of oxygen.

Subsequently, the crystal length of the silicon single crystal 16 and the concentration of oxygen when the molten liquid layer 17 is 160 mm depth, and the contact area between the molten liquid layer 17 and the inner wall of crucible 11 is 2009 cm² are measured, the result of which is shown in FIG. 6. The length of the silicon single crystal is indicated on the axis of abscissa, and the concentration of oxygen is on the axis of ordinate in FIG. 6. As is displayed in FIG. 6, an intermediate oxygen concentration region is where the concentration of oxygen is from $14 \times 10^{17}$ to $16 \times 10^{17}$ atoms/cc. The oxygen concentration of the silicon single crystal produced by the conventional CZ method described earlier is in the range of from $13 \times 10^{17}$ to $17 \times 10^{17}$ atoms/cc. Therefore, as is apparent from the graph, the silicon single crystal according to this invention shows the lower concentration of oxygen than that produced by the conventional CZ method.

Accordingly, from the above experimental results, when 65 kilograms of polysilicon material is filled in the crucible 11, it is preferable that the contact area of the molten liquid layer 17 and the inner wall of the crucible 11 is controlled to be not larger than 2000 cm² to obtain silicon single crystals of $12 \times 10^{17}$ atoms/cc or lower concentration of oxygen.

Figure 7:
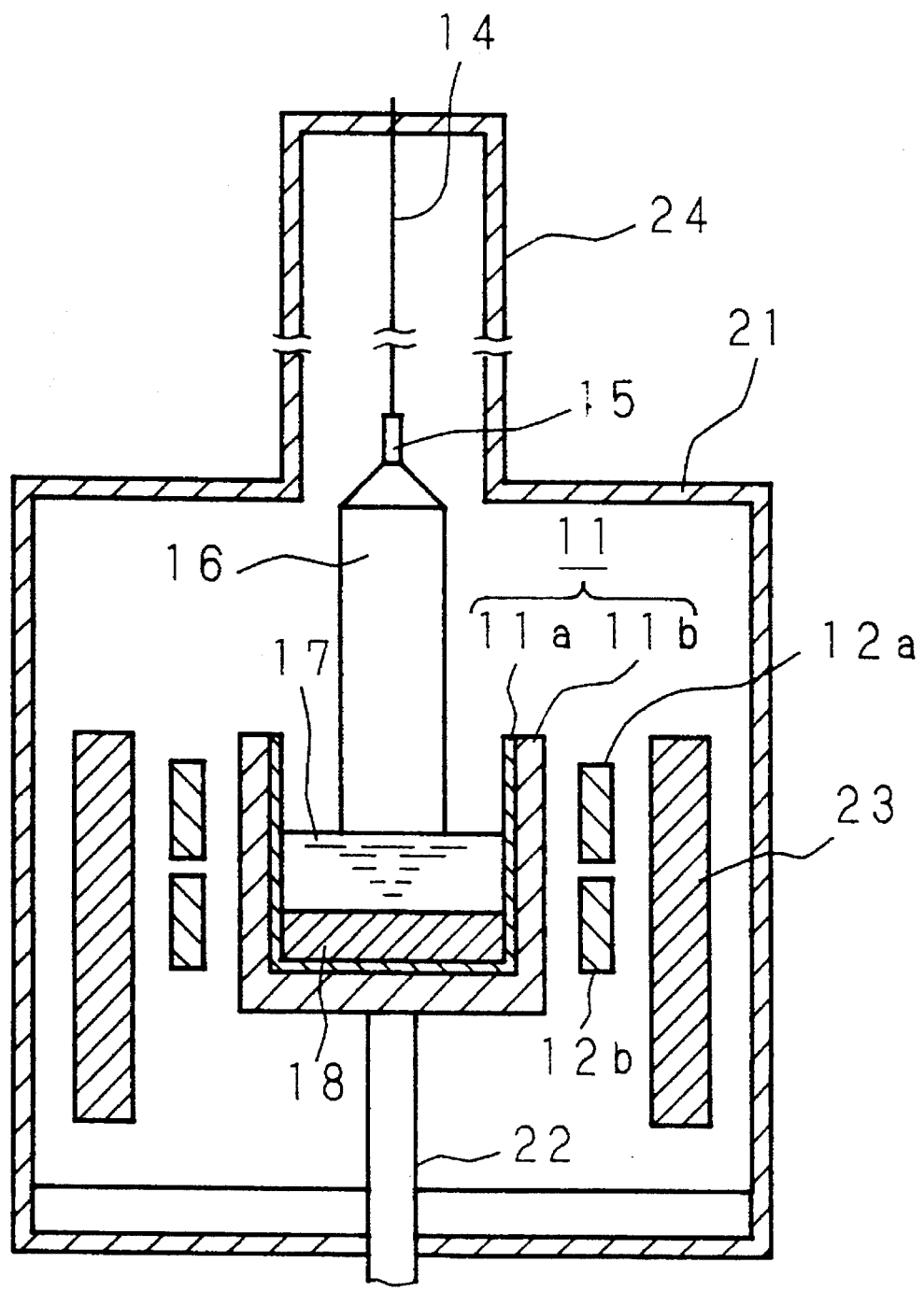
FIG. 7 is a schematic longitudinal sectional diagram of another growing apparatus of crystals employed in a Double Layered CZ method.

In the foregoing embodiment, the heater 12 or the crucible 11 is moved in the thicknesswise direction of the layers to adjust the thickness of the molten liquid layer 17 when the solid layer 18 is melted. However, the invention is not restricted to the embodiment, and a plurality of heaters may be provided and independently controlled to adjust the thickness of the molten liquid layer. FIG. 7 is a schematic sectional view showing a configuration of a single crystal growing apparatus provided with a plurality of heaters, used for execution of the method of the invention. At the outer periphery of the crucible 11, an upper heater 11a and a lower heater 12b are arranged. The upper heater 12a and the lower heater 12b are, for example, of resistance heating type and are supplied with electric power independently. The remaining configuration is same as that shown in FIG. 4, and the corresponding parts are designated by the same characters and the explanation is omitted.

In the case where a single crystal is made grown by using this single crystal growing apparatus, electric power is supplied to the upper heater 12a and the lower heater 12b so as to hold the temperature of a material for single crystal at a temperature of melting point of silicon or more, thereby melting a polysilicon filled in the crucible 11. The electric power to the lower heater 12a is reduced from this state so that the temperature of the material for single crystal at the lower part of the crucible 11 is lowered thereby to form a solid layer, and a molten liquid layer 17 coexists above the solid layer. By adjusting electric power supplied to the upper heater 12a and the lower heater 12b, the solid layer is melted, and by adjusting the contact area between the molten solid layer 17 and the inner wall of the crucible 11, the lift axis is pulled up so as to make a single crystal grow at the lower end of the seed crystal 15. In addition, explanation was given in this embodiment on the example in which two heaters are arranged in the direction of layer thickness, however, the number of heaters is not limited thereto, but a plural number of heaters will do.

According to this invention, since the contact area between the inner wall of the crucible and the molten liquid layer is adjusted, the eluting amount of oxygen from the crucible is controlled. Therefore, when the contact area is reduced, it becomes possible to produce silicon single crystals of the low concentration of oxygen by a simple apparatus with improved yield. The invention is accordingly considerably useful.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A method of producing a silicon single crystal, comprising steps of:

filling and melting a material for said single crystal in a crucible;

making a molten liquid layer of said material coexist with and on a solid layer of said material, while the melted material for single crystal is solidified upward from the bottom of said crucible into said solid layer;

melting said solid layer from an upper part thereof by heat of a heater disposed in a periphery of said crucible while adjusting contact area between said molten liquid layer and an inner wall of said crucible so as to control an eluting amount of oxygen from said crucible to said molten liquid layer; and growing the silicon single crystal by pulling it upward with taking in the oxygen in said molten liquid layer thereto.

2. A method of producing a silicon single crystal according to claim 1, wherein said step of melting said solid layer from the upper part thereof includes a step of adjusting the contact area between said molten liquid layer and the inner wall of said crucible not to be larger than 2000 cm².

3. A method of producing a silicon single crystal according to claim 1, wherein said crucible is moved in a direction of layer thickness so as to melt said solid layer.

4. A method of producing a silicon single crystal according to claim 1, wherein said heater is moved in a direction of layer thickness so as to melt said solid layer.

5. A method of producing a silicon single crystal according to claim 1, wherein said heater is plural in number arranged in a direction of layer thickness and supplied with electric powers respectively so as to melt said solid layer.

6. A method of producing a silicon single crystal according to claim 1, wherein the silicon single crystal has an oxygen content of $12 \times 10^{17}$ atoms/cc or lower.

* * * * *

UNITED STATES PATENT AND TRADEMARK OFFICE
CERTIFICATE OF CORRECTION

PATENT NO. : 5,477,806
DATED : December 26, 1995
INVENTOR(S) : Yoshihiro AKASHI et al It is certified that error appears in the above-indentified patent and that said Letters Patent is hereby corrected as shown below:

On title page,

Item [54] delete "SILISON" and insert -- SILICON --.

Column 1, line 2, change "SILISON" to read —SILICON—.

Signed and Sealed this

Twenty-sixth Day of March, 1996

Attest:

BRUCE LEHMAN

Attesting Officer     Commissioner of Patents and Trademarks